United States Patent [19]

Kinsbron et al.

[11] 4,346,125
[45] Aug. 24, 1982

[54] REMOVING HARDENED ORGANIC MATERIALS DURING FABRICATION OF INTEGRATED CIRCUITS USING ANHYDROUS HYDRAZINE SOLVENT

[75] Inventors: Eliezer Kinsbron, Highland Park; Frederick Vratny, Berkeley Heights, both of N.J.

[73] Assignee: Bell Telephone Laboratories, Incorporated, Murray Hill, N.J.

[21] Appl. No.: 214,171

[22] Filed: Dec. 8, 1980

[51] Int. Cl.³ .............................................. H01L 21/70
[52] U.S. Cl. ....................................... 427/96; 156/643; 156/656; 156/657; 156/659.1; 156/668; 427/259; 427/336
[58] Field of Search .......................... 427/96, 259, 336; 430/331; 156/643, 656, 657, 659.1, 668

[56] References Cited

U.S. PATENT DOCUMENTS 3,873,361 3/1975 Franco et al. .......................... 427/88
4,218,283 8/1980 Saiki et al. .............................. 427/96
4,238,528 12/1980 Angelo et al. .......................... 427/96

OTHER PUBLICATIONS

Audrieth et al., "Non-Aqueous Solvents", pp. 129–134, John Wiley & Sons, Inc., N.Y., ©1953.
Moran et al., "High Resolution, Steep Profile, Resist Patterns", The Bell System Technical Journal, May–Jun. 1979, vol. 58, No. 5.
Hom-ma et al., "A New Lift-Off Metallization Technique for High Speed Bipolar LSI's", Central Research Laboratory, Hitachi, Ltd., Japan, ©1979, IEEE.

Primary Examiner—John D. Smith
Attorney, Agent, or Firm—Lucian C. Canepa

[57] ABSTRACT

In an integrated circuit fabrication sequence, a hardened mask pattern adhered to an underlying substrate is removed from the substrate by a solvent that comprises anhydrous hydrazine and dimethyl sulfoxide. The solvent rapidly penetrates the interface between the pattern and the underlying substrate and quickly breaks the adhesive bonds therebetween. Other materials (e.g., Al, Si, SiO₂) in the structure being fabricated are not deleteriously affected by the solvent.

12 Claims, 6 Drawing Figures

REMOVING HARDENED ORGANIC MATERIALS DURING FABRICATION OF INTEGRATED CIRCUITS USING ANHYDROUS HYDRAZINE SOLVENT

BACKGROUND OF THE INVENTION

This invention relates to the fabrication of integrated circuits (ICs) and, more particularly, to the removal of hardened organic materials during the fabrication of ICs.

In a number of IC fabrication sequences of practical importance, it is necessary to remove from the IC structure being fabricated a highly adherent hardened pattern made of an organic material. Ideally, the removal of the material should be accomplished quickly and in a manner that does not deleteriously affect any of the other materials included in the IC structure.

A known fabrication method available for making high-resolution metallization patterns in IC structures is the so-caled lift-off process. In one version of this process, a patterned layer made of a heat-hardened organic material is formed on an underlying layer. Preselected portions of the underlying layer are not covered by the patterned layer. A metallic layer is then deposited on top of the patterned layer and on top of the uncovered portions of the underlying layer. Thereafter, the hardened pattern is removed whereby the metallic regions deposited thereon are "lifted off". The metallic regions remaining on the underlying layer constitute the desired metallization pattern required for the IC structure.

Other IC fabrication processes are known in which a pattern of organic material must be removed from the structure being made. For example, it is known to employ an organic pattern as a mask for reactive ion etching. During the etching step, the masking pattern may be hardened by the impingement of ions thereon. Rapid and selective removal of the hardened pattern, without substantially affecting other materials in the IC structure, then becomes a difficult task.

Heretofore, various dry etching techniques and liquid solvents have been utilized in IC fabrication sequences to remove hardened organic materials. But, in some cases of practical importance, this removal occurs in an undesirably slow manner and/or by a process that deleteriously etches or otherwise attacks other materials in the IC structure.

Accordingly, continuing efforts have been made by workers in the IC art directed at trying to develop IC fabrication processes in which hardened organic materials utilized as masking patterns can be rapidly and reliably removed from the structure being made. It was recognized that such efforts, if successful, could significantly improve the quality and lower the cost of IC devices.

SUMMARY OF THE INVENTION

Hence, an object of the present invention is an improved procedure for making IC devices. More specifically, an object of this invention is an improved way of removing hardened organic material during the fabrication of such devices.

Briefly, these and other objects of the present invention are realized in an embodiment thereof in which an organic pattern utilized as a mask in fabricating an IC device is removed rapidly and without deleteriously affecting any of the other materials included in the device. In one specific illustrative embodiment, the mask pattern is made of a polyimide material. In another embodiment, the mask pattern is made of a resist material such as a novalac-type polymer. For all embodiments, the formulation utilized to remove the pattern comprises anhydrous hydrazine. Advantageously, the formulation is a liquid mixture comprising 80-to-95 percent by volume of anhydrous hydrazine and 5-to-20 percent by volume of dimethyl sulfoxide. Applying the formulation at room temperature to the surface of the IC device is effective to remove the patterned material.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

A number of IC fabrication processes involve the formation and the subsequent removal of a hardened pattern made of an organic material. One such process, particularly advantageous for making very-large-scale-integrated (VLSI) devices, is the one described by J. M. Moran and D. Maydan in "High Resolution, Steep Profile, Resist Patterns", in *The Bell System Technical Journal,* Volume 58, No. 5, May–June 1979, pp. 1027–1036. This process is also described in a commonly assigned copending U.S. application of D. B. Fraser, D. Maydan and J. M. Moran designated Ser. No. 941,369, filed Sept. 11, 1978, now U.S. Pat. No. 4,244,799. The described process, which is sometimes referred to as the trilevel process, is characterized by submicron resolution with excellent linewidth control and step coverage.

Herein, for illustrative purposes, applicants' invention will be described in the specific context of removing a thick patterned layer utilized in the aforespecified trilevel process. It is to be understood, however, that applicants' invention is not limited in its applicability to the trilevel process. The invention can be employed to advantage in a variety of other IC fabrication sequences which require the removal of a hardened pattern of organic material.

Figure 1:
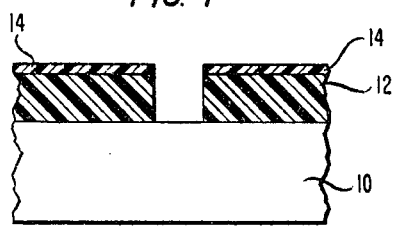
FIGS. 1 through 3 respectively represent steps in a specific illustrative fabrication sequence carried out in accordance with the principles of the present invention.

FIG. 1 depicts a high-resolution steep-profile pattern made in accordance with the aforespecified trilevel processing sequence. For illustrative purposes, the pattern is shown formed on a VLSI substrate 10 which comprises, for example, a silicon wafer that has been previously processed by standard techniques known in the art. On top of the substrate 10 is a pattern 12 made of a hardened organic material. By way of example, the pattern 12 is approximately 1.8 $\mu$m thick. Typical materials therefor will be specified below. Deposited on top of the pattern 12 is a so-called intermediate masking layer 14 approximately 0.12 $\mu$m thick and made, for example, of plasma-deposited silicon dioxide. In prior steps of the standard trilevel process, the layer 14 was selectively etched using a thin overlying high-resolution resist pattern (not shown) as the mask therefor. The pattern in the relatively thin layer 14 was then transferred into the underlying layers to form the pattern 12, by conventional techniques known in the art.

To illustrate one specific example of the applicability of applicants' invention for fabricating VLSI device, the structure shown in FIG. 1 will be assumed to be utilized in a so-called lift-off process. By means of the process, a high-resolution pattern is formed on those regions of the surface of the substrate 10 that are not covered by the pattern 12. In particular, assume that a high-resolution aluminum pattern is to be formed on the substrate 10.

Illustratively, the step of depositing aluminum onto the FIG. 1 structure involves a conventional evaporation or sputtering operation. Typically, such a deposition step is carried out at relatively high temperatures, for example at a temperature as high as 300 degrees C. Hence, it is important for high-resolution definition purposes that the pattern 12 be made of a material that will not flow or otherwise change its profile at these elevated temperatures. If deformation of the masking pattern 12 occurs, the aluminum that is deposited on the substrate 10 will be different in configuration from that originally specified and defined by the pattern 12. For high-resolution VLSI applications, such differences may be unacceptable.

Suitable high-temperature-tolerant polymer materials are available for making the pattern 12 shown in FIG. 1. Illustrative such materials include a polyimide designed PIQ made by Hitachi Ltd., Tokyo, Japan, a polyimide designated Pyralin made by E. I. duPont de Nemours and Co., Wilmington, Del. and a class of novalac-type resists designated HPR made by Philip A. Hunt Chemical Corp., Palisades Park, N.J.

Other suitable materials available for making the pattern 12 include standard products such as KPR, KMER, AZ1350 and Polycrome resists.

High-temperature baking of the aforespecified organic materials is effective to harden them and thus to make patterns made of them substantially resistant to subsequent high-temperature processing steps such as evaporation or sputtering. Unfortunately, a concomitant result of such hardening is that the patterns once baked are difficult to remove subsequently by conventional techniques.

Hardening of the aforespecified organic materials is carried out after depositing, but before patterning, a layer thereof. Illustratively, a layer made of the aforespecified PIQ material is hardened by baking the layer at 200-to-350 degrees C. for approximately 30-to-180 minutes. Hardening of the Pyralin polyimide material is effected by baking at 200-to-350 degrees C. for approximately 30-to-180 minutes. Hardening of the HPR resists is carried out, for example, by baking at 210 degrees C. for about 120 minutes.

Figure 2:
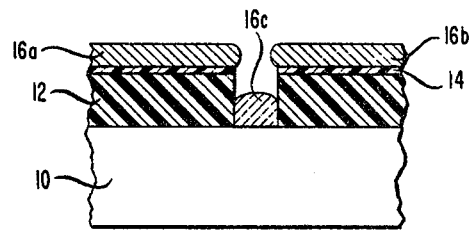

The pattern 12 shown in FIG. 1 is assumed to have been hardened as specified above. Next, a highly adherent layer made, for example, of aluminum is deposited on top of the layer 14 and on surface regions of the substrate 10 not covered by the pattern 12. Such an aluminum layer formed, for example, by evaporation is shown in FIG. 2. The portions of the aluminum layer deposited on top of the layer 14 are designated 16a and 16b, and the portion deposited on the substrate 10 is designated 16c.

In the lift-off process, the aluminum portions 16a and 16b shown in FIG. 2 are removed from the depicted structure thereby leaving only the portion 16c as the desired metallization pattern. In accordance with the principles of the present invention, the portions 16a and 16b are removed by utilizing a unique and effective liquid formulation that removes the hardened pattern 12 from the structure.

The formulation devised by applicants for removing the hardened pattern 12 (FIG. 2) comprises anhydrous hydrazine. Advantageously, the formulation is a mixture of anhydrous hydrazine and dimethyl sulfoxide. Both of these constituents are readily available commercial products. Advantageously, the mixture comprises by volume 80-to-95 percent anhydrous hydrazine and 5-to-20 percent dimethyl sulfoxide. This preferred mixture is designed to be applied by any standard technique to the surface of the FIG. 2 structure. When so applied, the mixture rapidly penetrates the interfaces between the sides of the aluminum portion 16c and the sides of the hardened pattern 12 as well as the interface between the pattern 12 and the substrate 10. Moreover, the penetrating mixture is effective to break the adhesive bonds between the materials at the specified interfaces. At the same time, portions of the pattern 12 are being dissolved by the applied mixture.

The inclusion of 5-to-20 percent dimethyl sulfoxide in applicants' formulation enhances the penetrating action thereof. As a result, rapid removal of hardened patterns of the type specified herein is achieved. But, alternatively, in accordance with the principles of applicants' invention, a formulation including only anhydrous hydrazine or a formulation including some but less than 5 percent dimethyl sulfoxide mixing with anhydrous hydrazine is feasible. With these last-mentioned formulations, interface penetration is less than that exhibited by the aforespecified preferred mixture and, accordingly, removal of the hardened pattern, by a combination of dissolution and limited penetration, typically takes longer.

During the aforespecified removal process, the interface between the bottom of the portion 16c and the substrate 10 of FIG. 2 is substantially unaffected by applicants' formulations. Accordingly, the portion 16c, which is the desired final metallization pattern, remains on the substrate 10, as depicted in FIG. 3.

Figure 3:
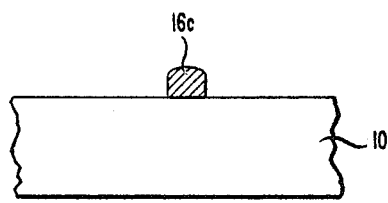

In actual structures of the type shown in FIGS. 2 and 3, the portions 16a and 16b were removed by the aforespecified formulations in a matter of several seconds to several minutes. Applications of the formulation at room temperature (approximately 20 degrees C.) is feasible. By raising the temperature to say 50 degrees C., the time required for the removal reaction is shortened.

Applicants' herein-specified formulations are toxic and potentially flammable. Hence, appropriate standard handling and processing precautions must be followed to avoid inhaling vapors from the formulations and to avoid ignition thereof.

It is advantageous to carry out the above-specified removal process in a confined enclosure, for example in a closed glass container. Personnel are thereby protected from any vapors that may emanate from the structure during processing while, at the same time, the process can thereby be visually monitored. Further, the possibility of contaminating the process by introducing water is thereby minimized.

Significantly, the aforespecified formulations are highly selective in their action. As described above, the preferred formulation in particular is effective to quickly break the adhesive bonds between the hardened pattern 12 and the underlying substrate 10 thereby achieving a rapid lift-off of the aluminum portions 16a and 16b (FIG. 2). At the same time, the formulations do not affect to any substantial extent the bond between the portion 16c and the substrate 10. Moreover, the formulations do not to any substantial extent etch or otherwise deleteriously affect the surfaces of the aluminum portion 16c or any exposed silicon or silicon dioxide.

Figure 4:
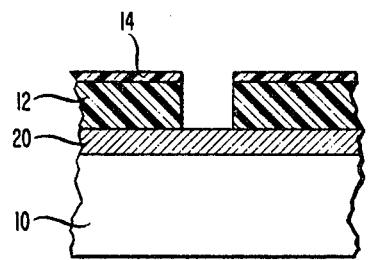
FIGS. 4 through 6 respectively illustrate steps in another fabrication sequence that embodies the principles of this invention.
Figure 5:
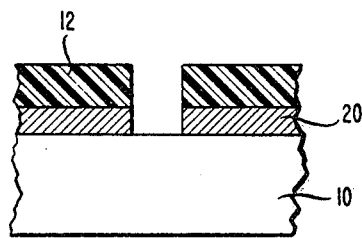
Figure 6:
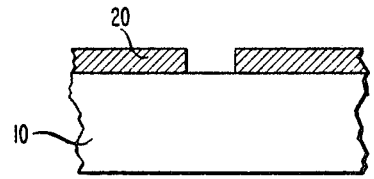

An IC etching sequence for aluminum, utilizing the aforedescribed trilevel process, is represented by FIGS. 4 through 6. As in the above-described lift-off process, the etching sequence involves removing a hardened organic material by means of the aforespecified formulation devised by applicants.

For illustrative purposes, some of the elements included in the FIG. 4 structure will be considered to be identical to elements specified above in connection with FIGS. 1 through 3. In FIG. 4, these elements are identified by the same reference numerals employed therefor in FIGS. 1 through 3. These elements comprise the substrate 10, the pattern 12 and the layer 14. The FIG. 4 structure further comprises a 0.7-$\mu$m-thick layer 20 made of aluminum. In the depicted fabrication sequence, the layer 20 is to be etched utilizing the pattern 12 as a mask therefor. Thereafter, the pattern 12 is to be removed from the depicted structure.

Various processes are known for anisotropically etching the aluminum layer 20 shown in FIG. 4. One advantageous such process is a plasma-assisted dry etching technique utilizing a $BCl_3$-$Cl_2$ gas mixture as the etchant, as described in a copending commonly assigned application of H. J. Levinstein and D. N. Wang, Ser. No. 929,567, filed July 31, 1978, now U.S. Pat. No. 4,256,534.

By utilizing the above-specified plasma-assisted etching technique, the high-resolution features defined by the pattern 12 of FIG. 4 are transferred into the layer 20. In the course of etching the layer 20, the layer 14 overlying the pattern 12 is removed from the depicted structure. The resulting structure is shown in FIG. 5.

In the aforedescribed plasma-assisted etching step, the pattern 12 of FIG. 5 is typically hardened due to the impingement thereon of particles from the etching plasma. (This occurs whether or not the pattern 12 had also been hardened previously by baking.) Because of this hardening, the task of subsequently removing the pattern 12 from the structure is in practice a difficult one. And known removal techniques such as dry etching with an oxygen plasma may not be feasible because of possible damage (breakdown) caused thereby to the thin silicon dioxide (gate oxide) layer (not shown) typically included in such structures.

In accordance with the principles of the present invention, the pattern 12 of FIG. 5 is rapidly removed from the etched aluminum layer 20 without interfering with the bond between the substrate 10 and the layer 20. This is done by utilizing the above-specified formulations devised by applicants. Even at room temperature, the preferred formulation quickly penetrates the interfaces between the pattern 12 and the underlying aluminum pattern 20 and breaks the adhesive bonds therebetween. The hardened pattern 12 is thereby in effect lifted off the pattern 20. The resulting structure is shown in FIG. 6. In turn, further subsequent processing steps are carried out on the FIG. 6 structure to realize a specified IC device. These steps may include additional pattern definition operations in which applicants' formulations are again utilized to remove hardened material of the type described herein.

Finally, it is to be understood that the above-described techniques are only illustrative of the principles of the present invention. In accordance with these principles, numerous modifications and alternatives may be devised by those skilled in the art without departing from the spirit and scope of the invention.

What is claimed is:

1. A method of fabricating an IC device, comprising the steps of
   forming in a multi-layered device structure a hardened pattern of organic material to cover all but selected surface portions of said device structure,
   processing said selected surface portions utilizing said hardened pattern as a mask therefor,
   and, subsequent to said processing step, removing said hardened pattern by applying to said device structure a formulation that comprises anhydrous hydrazine.

2. A method as in claim 1 wherein said formulation comprises a mixture of anhydrous hydrazine and dimethyl sulfoxide.

3. A method as in claim 2 wherein said formulation comprises 80-to-95 percent by volume anhydrous hydrazine and 5-to-20 percent by volume dimethyl sulfoxide.

4. A method as in claims 1, 2 or 3 in which said hardened pattern comprises a baked pattern of PIQ polyimide.

5. A method as in claims 1, 2 or 3 in which said hardened pattern comprises a baked pattern of Pyralin polyimide.

6. A method as in claims 1, 2 or 3 in which said hardened pattern comprises a baked pattern of HPR resist.

7. A method as in claim 3 in which said removing step is carried out at a temperature in the range 20-to-50 degrees C.

8. A method as in claim 3 in which said processing step comprises depositing a conductive layer on said selected surface portions and on said pattern.

9. A method as in claim 3 in which said processing step comprises etching said selected surface portions.

10. A method of fabricating an IC device, comprising the steps of
    forming in a multilayered device structure a hardened pattern (12) of organic material to cover all but selected surface portions of said device structure,
    processing said selected surface portions utilizing said hardened pattern as a mask therefor,
    and, subsequent to said processing step, removing said hardened pattern from said device structure, characterized in that
    said removing step comprises applying to said device structure a formulation that comprises anhydrous hydrazine.

11. A method as in claim 10 wherein said formulation comprises a mixture of anhydrous hydrazine and dimethyl sulfoxide.

12. A method of fabricating an IC device structure, comprising the steps of
    forming a hardened pattern of organic material to cover all but selected surface portions of said device structure,
    processing said selected surface portions utilizing said hardened pattern as a mask therefor,
    and, subsequent to said processing step, removing said hardened pattern by applying to said device structure a formulation that comprises only anhydrous hydrazine.

* * * * *